United States Patent
Qi et al.

(10) Patent No.: US 6,774,497 B1
(45) Date of Patent: Aug. 10, 2004

(54) FLIP-CHIP ASSEMBLY WITH THIN UNDERFILL AND THICK SOLDER MASK

(75) Inventors: Jing Qi, Lake Zurich, IL (US); Janice M. Danvir, Arlington Heights, IL (US); Tomasz L. Klosowiak, Glenview, IL (US); Prasanna Kulkarni, Schaumburg, IL (US); Nadia Yala, Schaumburg, IL (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/402,631

(22) Filed: Mar. 28, 2003

(51) Int. Cl.[7] .............................................. H01L 23/48
(52) U.S. Cl. ...................... 257/783; 257/778; 438/118
(58) Field of Search ................................ 257/783, 778, 257/779, 780, 781; 438/118, 108

(56) References Cited

U.S. PATENT DOCUMENTS

| | | | |
|---|---|---|---|
| 5,925,936 A | 7/1999 | Yamaji | |
| 6,121,689 A | 9/2000 | Capote et al. | |
| 6,190,940 B1 * | 2/2001 | DeFelice et al. | 438/106 |
| 6,194,788 B1 | 2/2001 | Gilleo et al. | |
| 6,228,678 B1 * | 5/2001 | Gilleo et al. | 438/108 |
| 6,265,776 B1 * | 7/2001 | Gilleo | 257/738 |
| 6,271,107 B1 * | 8/2001 | Massingill et al. | 438/597 |
| 6,294,840 B1 * | 9/2001 | McCormick | 257/778 |
| 6,365,441 B1 | 4/2002 | Raiser et al. | |
| 6,410,415 B1 * | 6/2002 | Estes et al. | 438/612 |
| 6,507,118 B1 * | 1/2003 | Schueller | 257/778 |
| 6,560,122 B2 * | 5/2003 | Weber | 361/783 |

FOREIGN PATENT DOCUMENTS

WO     WO 99/56312     11/1999

* cited by examiner

*Primary Examiner*—S. V. Clark (57) ABSTRACT

The invention provides a method for attaching a flip chip to an electrical substrate such as a printed wiring board. A bumped flip chip is provided, the flip chip including an active surface and a plurality of connective bumps extending from the active surface, each connective bump including a side region. A thin layer of an underfill material is applied to the active surface of the flip chip and to a portion of the side regions of the connective bumps. The flip chip is positioned on the electrical substrate, the electrical substrate including a thick layer of a solder mask disposed on the electrical substrate. The flip chip is heated to electrically connect the flip chip to the electrical substrate, wherein the underfill material and the solder mask combine to form a stress-relief layer when the flip chip is electrically connected to the electrical substrate.

27 Claims, 4 Drawing Sheets

FLIP-CHIP ASSEMBLY WITH THIN UNDERFILL AND THICK SOLDER MASK

This invention was made with United States Government support under Agreement NO. 70NANB8H4007 awarded by the National Institute of Standards and Technology (NIST). The United States Government has certain rights in the invention.

FIELD OF THE INVENTION

This invention relates generally to semiconductor wafer processing and integrated circuit packaging. In particular, the invention relates to bumped semiconductor wafers with wafer-applied underfill, flip chips and flip-chip assemblies, and a method of manufacturing a semiconductor wafer, a flip-chip, or a flip-chip module with a conjoined underfill and solder mask layer.

BACKGROUND OF THE INVENTION

Assembly of bumped flip chips to printed wiring boards (PWB) and other electronic substrates has become an important pursuit in the microelectronic industry. As more of these components are assembled to form cost-effective electronic modules and flip-chip assemblies, the need increases for an underfill system that obviates the time-consuming sequences required by capillary flow of underfill materials in current assembly processes. Underfill material structurally reinforces the solder bumps, mechanically adheres the flip chip to the PWB, and improves the reliability of the assembly.

Flip chips are formed with ball-shaped beads or bumps of solder affixed to their input/output (I/O) bonding pads. The integrated circuit (IC) flip chip or die may be bonded directly to a packaging substrate, without the need for a separate wirebonded leadframe or for separate I/O connectors such as wires or tapes. During packaging, the chip is "flipped" onto its active circuit surface so that the solder balls form electrical connections directly between the bumped chip and conductive traces on a packaging substrate or motherboard.

Underfill materials are typically applied between the surface of the IC and the PWB. In the liquid underfill dispense technique, the underfill is applied at one or more edges of the flip-chip bonded die and capillary action wicks the fluid under the die. During this process, the entire die surface is coated with the underfill. When using highly viscous, no-flow underfills, the underfill may be applied to the PWB prior to die placement. During solder reflow, the underfill liquefies and wets the die site on the PCB and the die surface at the bottom and on the edges of the die.

The capillary flow technology uses underfill encapsulant material of a suitable polymer in the void between the chip and the substrate. The underfill material is typically dispensed around two adjacent sides of the semiconductor chip, with the underfill material flowing by capillary action to fill the gap between the chip and the substrate. Baking or heat treatment then hardens the underfill material. The underfill encapsulant needs to adhere well to the chip and the substrate to improve the solder joint integrity. Underfilling the chip with a subsequently cured encapsulant typically reduces solder joint cracking caused by a thermal expansion mismatch between the chip and the substrate. The cured encapsulant reduces the level of stresses on the solder joints, induced by differential expansion and contraction. An example of an underfill material being applied around the periphery of a flip-chip assembly and partially wicked into the interior region is described by Ralser, et al., in U.S. Pat. No. 6,365,441, "Partial Underfill for Flip Chip Electronic Packages" issued Apr. 2, 2002.

A single layer of underfill encapsulant with an interdispersed flux is described in U.S. Pat. No. 6,194,788, "Flip Chip with Integrated Flux and Underfill" by Gilleo et al. issued Feb. 27, 2001. The manufacturing process uses one step to apply a bumped flip chip with the fluxing underfill to a printed circuit, rather than separate fluxing and underfilling steps.

Underfilling methods may use an underfill layer on the die surface and flux applied to a PCB. Yamaji presents an underfill on the surface of a chip and top ends of the bumps, with the flux on the mounting substrate, as described in U.S. Pat. No. 5,925,936, "Semiconductor Device for Face Down Bonding to a Mounting Substrate and a Method of Manufacturing the Same" issued Jul. 20, 1999. Capote and others disclose a simplified process for flip-chip attachment to a substrate, which pre-coats the bumped IC chip with an encapsulant underfill material, as described in U.S. Pat. No. 6,121,689, "Semiconductor Flip-Chip Package and Method for the Fabrication Thereof" issued Sep. 19, 2000. The encapsulant encases the bumps that extend from contacts on the surface of the chip to the pads of the substrate.

An underfill process using separated flux and underfill that are applied to the die are described by Gilleo, et al., in application WO 99/56312, "Flip Chip with Integrated Flux, Mask and Underfill," published Nov. 4, 1999.

The underfill process often makes the assembly of encapsulated flip-chip printed wire boards (PWB) a time consuming, labor intensive and expensive process with a number of uncertainties. To join the integrated circuit to the substrate, flux generally is placed on the chip or substrate and then the IC is placed on the substrate. The assembly is subjected to a solder reflowing thermal cycle, melting the bumps and soldering the chip to the substrate. The surface tension of the solder aids in the self-alignment of the chip to the substrate pads. Underfill encapsulation of the chip generally follows after reflow.

One of the disadvantages of this encapsulation process is its reduced production efficiency because the underfilling and curing of the encapsulant is a multi-step process, requiring the material to flow through the tiny gap between the chip and the substrate. As chip size increases, the capillary action of the encapsulation procedure becomes even more time-consuming, and is more susceptible to void formation and to the separation of the polymer from the fillers during application. Another general problem is that any flux residue remaining in the gap may reduce the adhesive and cohesive strengths of the underfill-encapsulating adhesive. Furthermore, as the pitch between adjacent bumps decreases, uniform flow of underfill materials becomes increasingly difficult. One solution to this problem is disclosed in U.S. Pat. No. 6,294,840, "Dual-Thickness Solder Mask in Integrated Circuit Package," by McCormick, issued Sep. 25, 2001.

In recent research on encapsulation processes, a semiconductor wafer with an array of integrated circuits is coated with underfill material that is approximately the same height as the bumps of a die, before the bumped chips are soldered to a substrate. This thick coating may result in the interference with solder joint formation between the bumps and pads on the electrical substrate. Unfortunately, the close proximity of the underfill to the bump-pad interface can create a physical barrier to consistent, reliable soldering. This approach relies solely on the pre-applied underfill material to fill the gap between the chip and the substrate. The thickness of the underfill-material coating, which is approximately the same height as the bumps of the die, can result in problems during the placement of the die. The thick underfill coating may alter the size and shape of the exposed area of the tops of the solder bumps. These tops may be used as locating features for placement. With coated chips, the exposed area above the bumps is random and the bump diameter may be hard to define, making it difficult to inspect and register the coated parts prior to placement. However, when thinner coatings are used, the volume of pre-applied underfill material is insufficient to fill the gap between the chip and the substrate.

It would be beneficial to have a packaging technology for directly attaching bumped flip chips to an underlying electrical substrate or PWB that allows secure electrical and mechanical die attach to the PWB, while eliminating the need for time-consuming dispensing operations for dispensing underfill materials around attached flip chips, as required by current capillary-flow underfill methods. The packaging technology would allow the flip chips to be bonded effectively to a substrate, with highly reliable electrical interconnections and protective underfill material for secure die bonding, stress relief for the bumps and effective environmental protection. Furthermore, the technology would not require pre-coating material up to the top of the solder bumps, would eliminate bump-recognition challenges, and would eliminate an additional tack step typically needed to maintain alignment. Flexibility to apply an optional flux layer before or after bulk epoxy coatings is also desirable.

It would be beneficial, therefore, to provide an improved method for attaching a flip chip to an electrical substrate and a process for applying underfill at the chip or wafer level, which provide above-mentioned improvements and overcome the deficiencies and obstacles described above.

SUMMARY OF THE INVENTION

One aspect of the invention provides a method for attaching a flip chip to an electrical substrate. A bumped flip chip is provided that includes an active surface and a plurality of connective bumps extending from the active surface, each connective bump including a side region. A thin layer of an underfill material is applied to the active surface of the flip chip and to a portion of the side regions of the connective bumps. The flip chip is positioned on the electrical substrate that includes a thick layer of a solder mask disposed on the electrical substrate. The flip chip is heated to electrically connect the flip chip to the electrical substrate, wherein the underfill material and the solder mask combine to form a stress-relief layer when the flip chip is electrically connected to the electrical substrate.

Another aspect of the invention provides a flip-chip assembly. The flip-chip assembly comprises a bumped flip chip with an active surface and a plurality of connective bumps extending from the active surface. A thin layer of an underfill material is disposed on the active surface of the flip chip and on a portion of a side region of the connective bumps. The bumped flip chip is electrically connected to an electrical substrate that includes a thick layer of a solder mask, the solder mask and the underfill material combining to form a stress-relief layer.

Another aspect of the invention provides a wafer-applied underfill process. A bumped semiconductor wafer including an active surface and a plurality of connective bumps extending from the active surface is provided. An underfill material is applied to the active surface of the semiconductor wafer and a portion of a side region of the connective bumps, wherein the underfill material extends from the active surface to a thickness between nominally 20 percent and 60 percent of a connective bump height. The underfill material is heated to flow around the connective bumps.

The present invention is illustrated by the accompanying drawings of various embodiments and the detailed description given below. The drawings should not be taken to limit the invention to the specific embodiments, but are for explanation and understanding. The detailed description and drawings are merely illustrative of the invention rather than limiting, the scope of the invention being defined by the appended claims and equivalents thereof. The foregoing aspects and other attendant advantages of the present invention will become more readily appreciated by the detailed description taken in conjunction with the accompanying drawings.

BRIEF DESCRIPTION OF THE DRAWINGS

Various embodiments of the present invention are illustrated by the accompanying figures, wherein.

DETAILED DESCRIPTION OF THE PRESENTLY PREFERRED EMBODIMENTS

Figure 1:
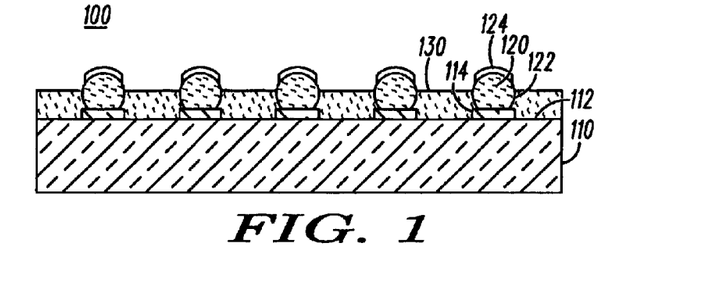
FIG. 1 illustrates a cross-sectional view of a bumped flip chip, in accordance with one embodiment of the current invention.

FIG. 1 shows a cross-sectional view of a bumped flip chip, in accordance with one embodiment of the present invention at 100. Bumped flip chip 100 includes a semiconductor substrate 110 with an active surface 112, and a plurality of connective bumps 120 with side regions 122 extending from active surface 112. Bumped flip chip 100 includes an underfill material 130 applied to active surface 112 and to a portion of side regions 122 of connective bumps 120.

Bumped flip chip 100 may contain a multitude of active components, passive components, or any combination thereof. Bumped flip chip 100 may contain electronic components such as resistors, capacitors, and transistors. These components may be integrated into bumped flip chip 100, which may contain one or more integrated circuits. Bumped flip chip 100 may include a set of electrical interconnect traces and flip-chip pads 114.

Semiconductor substrate 110 typically contains active and passive electronic devices such as transistors, capacitors and resistors forming one or more integrated circuits on active surface 112 of semiconductor substrate 110. External connections to the integrated circuit are made through metal traces and pads 114 that are part of active surface 112. For clarity, dielectric layers, passivation layers, metal interconnect layers and contacts that form the interconnections to the integrated circuit are not illustrated. Semiconductor substrate 110 may be, for example, a silicon substrate, a gallium-arsenide substrate, or other electronic or optoelectronic substrate as is currently known in the art.

Connective bumps 120 are formed on pads 114 and are typically solder bumps or solder balls. A solder bump may be formed, for example, by electroplating one or more metals such as lead and tin to form a lead-tin solder bump. The solder bumps may be formed by depositing layers of one or more metals on active surface 112 of semiconductor substrate 110, and using conventional lithographical techniques to pattern and etch any undesired metal. The solder bumps may be heat-treated to melt the bumps and form rounded corners and tops. Connective bumps may be formed by selectively screen printing solder paste on pads 114, then heating it to melt the solder to form the bumps. Alternatively, connective bumps 120 may be formed by positioning solder balls on the pads and heating the solder balls to attach them to pads 114. Connective bumps 120 have sidewalls or side regions 122.

A flux layer 124 may be positioned on a top region of connective bumps 120. Flux layer 124 may include acidic components, for example, which remove oxides from the solder bumps or solder balls when melting or reflowing the bumps to an electrical substrate. Flux layer 124 may be located only on the tops of the bumps, or may cover the bumps and underfill material 130 by using, for example, a spraying or a dipping technique.

Underfill material 130 is disposed on active surface 112. Underfill material 130 provides a coating to protect the traces and pads of bumped flip chip 100 and to offer strain or stress relief for the solder bumps or solder balls when the flip chip is electrically connected to an electrical substrate such as a printed wiring board. Underfill material 130 supplies additional bonding strength for the die attach. Underfill material 130 also provides stress relief at the solder ball interfaces during temperature excursions of the flip-chip assembly, and provides environmental protection from moisture, particles, and other contamination that may degrade the performance of the flip chip.

Underfill material 130 typically covers at least a portion of side regions 122 of connective bumps 120. In one presently preferred embodiment of the invention, underfill material 130 extends from active surface 112 of semiconductor substrate 110 to a thickness, for example, between nominally 20 percent and 60 percent of the height of a connective bump. The thickness of underfill material 130 may be selected in coordination with the thickness of a solder mask to provide proper underfill material flow and to control fillets of underfill material around at least a portion of the edges of bumped flip chip 100 when assembled.

Underfill material 130 includes curable components that allow underfill material 130 to be pliable and formable during processing, yet to be hard and chemically resistant when bumped flip chip 100 is secured to an electrical substrate. Underfill material 130 may comprise a filled epoxy, such as a one- or two-part epoxy that contains insulating microspheres to separate bumped flip chip 100 from an electrical substrate during die attach processes. Fillers may be added to the selective underfill material to improve thermal expansion characteristics of the underfill material. Underfill material 130 may include, for example, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, or a suitable underfill compound.

Figure 2A:
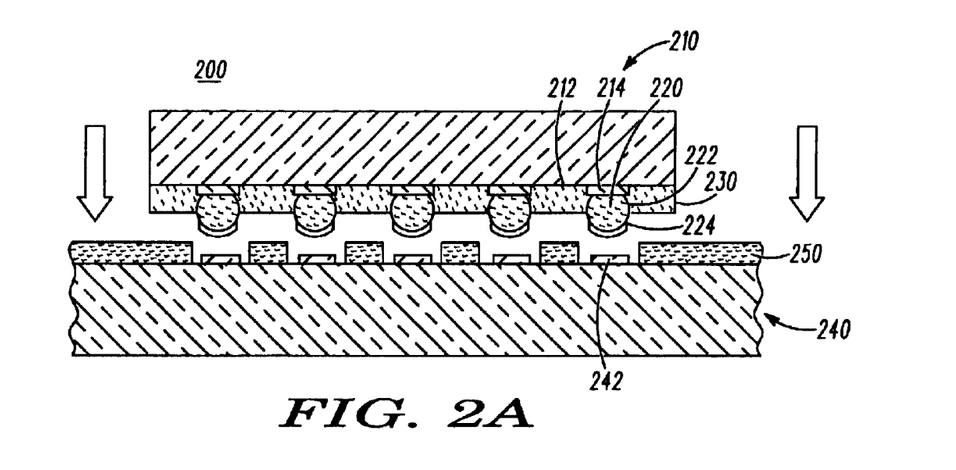
FIG. 2a illustrates a cross-sectional view of a bumped flip chip and an electrical substrate with a solder mask prior to attachment, in accordance with one embodiment of the current invention.
Figure 2B:
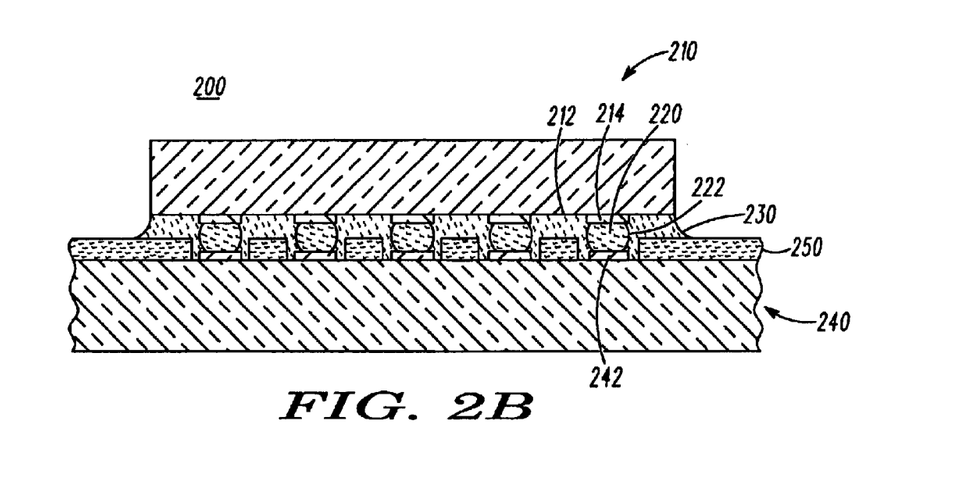
FIG. 2b illustrates a cross-sectional view of a bumped flip chip and an electrical substrate with a solder mask after attachment, in accordance with one embodiment of the current invention.

FIG. 2a and FIG. 2b illustrate a cross-sectional view of a bumped flip chip and an electrical substrate with a solder mask prior to and after attachment, in accordance with one embodiment of the present invention at 200. Flip-chip assembly 200 includes a bumped flip chip 210 and an electrical substrate 240. Bumped flip chip 210 includes an active surface 212 and a plurality of connective bumps 220 extending from active surface 212. Bumped flip chip 210 also includes a thin layer of an underfill material 230 disposed on active surface 212 of bumped flip chip 210. Electrical substrate 240 includes a thick layer of a solder mask 250 disposed on electrical substrate 240.

Connective bumps 220 may comprise at least one solder bump or at least one solder ball on the active surface of bumped flip chip 210. Connective bumps 220 have a side region 222. Connective bumps 220 are connected to pads 214 on active surface 212 of bumped flip chip 210.

Underfill material 230 comprises a material such as an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, or a suitable underfill compound. Underfill material 230 may be disposed on a portion of a side region of connective bumps 220.

Electrical substrate 240 may contain an array of interconnect traces and substrate pads 242 for electrically connecting bumped flip chip 210 to electrical substrate 240. Electrical substrate 240 includes a set of pads 242 on a surface of electrical substrate 240. Pads 242 correspond to connective bumps 220 on bumped flip chip 210, such that pads 242 become electrically connected to corresponding connective bumps 220 when bumped flip chip 210 and electrical substrate 240 are assembled. Electrical substrate 240 may contain one or more active and passive devices bonded to electrical substrate 240 or formed on electrical substrate 240.

Electrical substrate 240 may be any substrate to which bumped flip chip 210 can be attached. Electrical substrate 240 may be, for example, a printed wiring board, a printed circuit board, a flame-retardant fiberglass (FR4) board, an organic circuit board, a motherboard, or any single-layer or multi-layer board for housing and connecting electrical components. Electrical substrate 240 may be a ceramic substrate, a hybrid circuit substrate, or an integrated circuit package. Electrical substrate 240 may be a polyimide tape, a flex circuit, a high-density interconnect board, or an electronic module. Electrical substrate 240 may include other flip chips and other active and passive components. Electrical substrate 240 includes a solder mask 250.

Solder mask 250 typically covers the surface of electrical substrate 240, with holes or open portions above pads and selected other features. Solder mask 250 provides pockets for bumps to sit on or fit into when bumped flip chip 210 is positioned on electrical substrate 240 prior to reflow. Solder mask 250 constrains flow of the solder during assembly, preventing the solder from wetting metal traces and other metal features in unwanted areas. Solder mask 250 comprises any suitable material for protecting electrical substrate 240 during soldering processes such as reflow soldering, and for conjoining with underfill material 230 to provide a stress-relief layer and moisture-penetration barrier. Solder mask 250 may have a thickness, for example, on the order of 0.002 inches. Solder mask 250 works in tandem with a thin layer of underfill material 230 to provide a void-free die attach. Solder mask 250 may be separated from pads 242 as in a non-solder mask defined pad. Alternatively, solder mask 250 may overlap pads 242 in a solder-mask defined pad layout.

The thin layer of underfill material 230 may extend, for example, from active surface 212 to a thickness between nominally 20 percent and 60 percent of the height of connective bumps 220. The thick layer of solder mask 250 may comprise, for example, a thickness between nominally 40 percent and 80 percent of a connective bump height.

In one example of a bumped flip-chip assembly, bumped flip chip 210 has a thickness of 0.022 inches, an active surface 212 that is 0.394 inches by 0.472 inches with 483 connective bumps 220. The bumps are round with a diameter of 5.3 mils (thousandths of an inch) and a connective bump height of 4.8 mils. Corresponding pads 242 on electrical substrate 240 are 4 mils in diameter and 1.5 mils thick.

In another example of a bumped flip-chip assembly, bumped flip chip 210 has a thickness of 0.022 inches, an active surface 212 that is 0.787 inches by 0.866 inches with 220 connective bumps 220. The bumps are round with a radius of 3.15 mils (thousandths of an inch) and a connective bump height of 4.5 mils. Corresponding pads 242 on electrical substrate 240 are 5 mils in diameter and 1.5 mils thick.

Bumped flip chip 210 and electrical substrate 240 are typically connected by placing bumped flip chip 210 on top of electrical substrate 240. Connective bumps 220 on bumped flip chip 210 are placed through holes or windows in solder mask 250 corresponding to pads 242 on electrical substrate 240. Because solder mask 250 is thick relative to the height of a connective bump 220, and because underfill material 230 on bumped flip chip 210 is thin compared to the height of a connective bump 220, bumped flip chip 210 may be retained in its placed position by virtue of the bumps being placed in relatively deep pockets in the solder mask.

After other components are positioned on electrical substrate 240, the assembly may be sent through a convective or forced-air furnace to heat the flip chips and other components to connect them electrically to electrical substrate 240. The solder bumps or solder balls melt and become soldered to electrical substrate 240. Underfill material 230 may also soften and flow around side regions 222 of connective bumps 220. Underfill material 230 may also wet solder mask 250 and other PCB surfaces to form a strong adhesive bond. Alternatively, bumped flip chip 210 may be heated and pressed against electrical substrate to reflow the connective bumps and to flow underfill material 230 around side regions 222 of connective bumps 220 and to bond it to solder mask 250 and other portions of electrical substrate 240. Excess underfill material 230 may flow from between bumped flip chip 210 and electrical substrate 240. A portion of any excess underfill material 230 may wet the sides of bumped flip chip 210 and form a fillet around at least a portion of the sides.

A flux layer 224 may be positioned on the tops of connective bumps 220. Flux layer 224 may applied to at least a top portion of connective bumps 220. Flux layer 224 may be formed, for example, by screen printing, spraying or dipping bumped flip chip 210 into a suitable solder flux prior to reflow. Flux layer 224 may be applied before or after underfill material 230 is applied.

In an alternate embodiment, a layer of flux can be applied onto the electrical substrate. The flux may be, for example, a fluxing underfill that becomes part of the adhesive bond between the underfill and the solder mask, or it may be a no-solvent, no-clean flux that enhances soldering while not interfering with bonding between underfill material 230 and solder mask 250. During the assembly process, once the flux application step is completed, the bumped flip chip with pre-applied underfill material 230 is placed over the flux layer on the electrical substrate. The assembly is then heated to achieve the bonding between connective bumps 220 and electrical substrate 240.

When bumped flip chip 210 is electrically connected to electrical substrate 240, underfill material 230 and solder mask 250 combine to form a stress-relief layer. During reflow and curing, underfill material 230 may flow around connective bumps 220. After assembly, underfill material 230 and solder mask 250 cooperate to secure bumped flip chip 210 to electrical substrate 240, and to limit thermally-generated stresses that may occur at the interface between the bumps and the pads during large temperature excursions. The conjoined . underfill material 230 and thick solder mask 250 provide improved solder joint integrity of wafer-applied underfill.

Underfill material 230 and solder mask 250 form a moisture-penetration barrier when combined. After assembly, underfill material 230 and solder mask 250 cooperate to protect connective bumps 220, pads 214, pads 242, and any connective traces on either bumped flip chip 210 or electrical substrate 240 from water, moisture build-up, or any inadvertent spray of chemicals or other materials that may corrode or otherwise damage flip-chip assembly 200.

Underfill material 230 may also form fillets around the sides of bumped flip chip 210. During the reflow step and prior to curing, underfill material 230 may wet the sides of bumped flip chip 210, wicking up the sides and then hardening to form a smooth, protective coating for the bumps, pads and traces of bumped flip chip 210 and electrical substrate 240. The amount of underfill material 230 available to form the fillets can be controlled by providing a suitable excess height between pre-applied underfill material 230 and solder mask 250.

In one example of a bumped flip-chip assembly with a pre-assembled connective bump height of 4.8 mils, solder mask 250 has a thickness of 3.0 mils or 62.5 percent of the initial bump height. Underfill material 230 flows into and fills cavities around connective bumps 220 during assembly in this non-solder mask defined pad. For no fillet formation, the thickness of underfill material 230 is 2.0 mils or 42 percent of the initial bump height. For a nominally 45-degree fillet that does not wet the sides of bumped flip chip 210, the thickness of underfill material 230 is 2.5 mils or 52 percent of the initial bump height. For a nominally 45-degree fillet that wets one fourth of the side of the 22 mil thick bumped flip chip 210, the thickness of underfill material 230 is 2.9 mils or 60 percent of the initial bump height.

In another example of a bumped flip-chip assembly with a pre-assembled connective bump height of 4.5 mils, solder mask 250 has a thickness of 3.5 mils or 78 percent of the initial bump height. Underfill material 230 flows into and fills cavities around connective bumps 220 during assembly in this non-solder mask defined pad. For no fillet formation, the thickness of underfill material 230 is 2.1 mils or 47 percent of the initial bump height. For a nominally 45-degree fillet that does not wet the sides of bumped flip chip 210, the thickness of underfill material 230 is 2.3 mils or 51 percent of the initial bump height. For a nominally 45-degree fillet that wets one third of the side of the 22 mil thick bumped flip chip 210, the thickness of underfill material 230 is 2.7 mils or 60 percent of the initial bump height.

Figure 3:
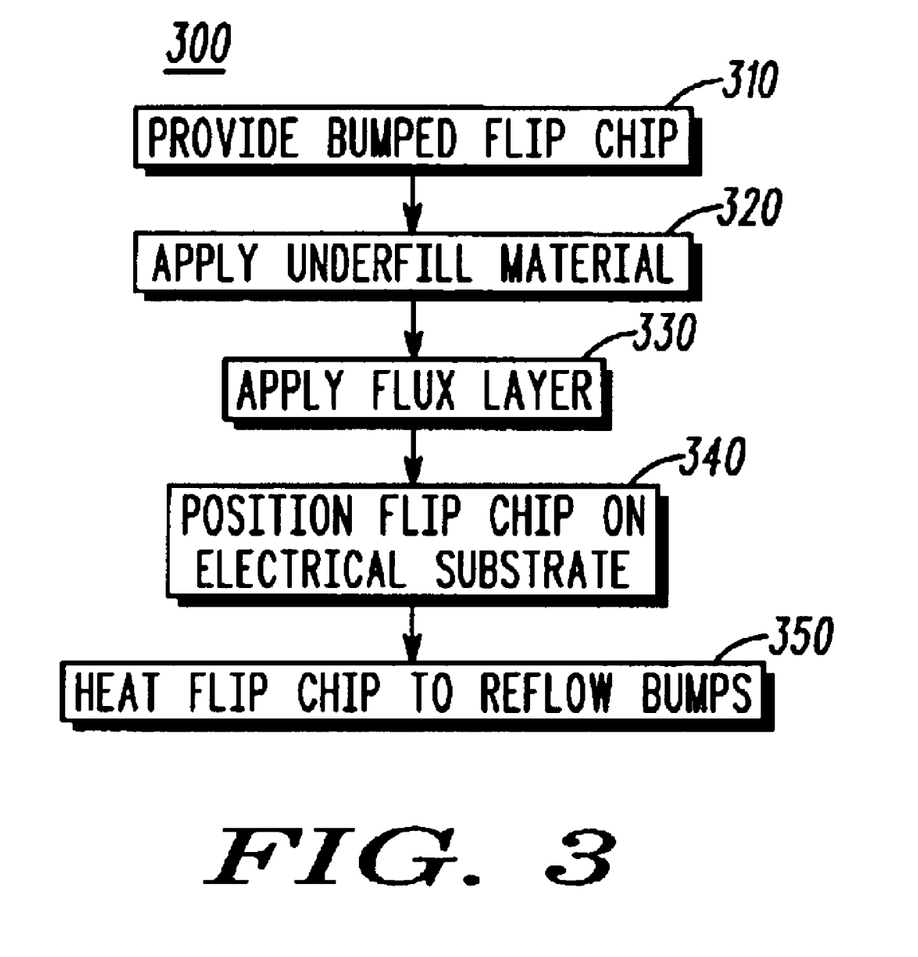
FIG. 3 illustrates a flow diagram of a method for attaching a flip chip to an electrical substrate, in accordance with one embodiment of the current invention.

FIG. 3 illustrates a flow diagram of a method for attaching a flip chip to an electrical substrate, in accordance with one embodiment of the present invention at 300. Flip-chip assembly method 300 includes steps to attach a flip chip to an electrical substrate.

A bumped flip chip is provided, as seen at block 310. The flip chip includes an active surface and a plurality of connective bumps extending from the active surface. Each connective bump includes a side region. The connective bumps may comprise at least one solder bump or at least one solder ball on the active surface of the flip chip.

A thin layer of an underfill material is applied to the active surface of the flip chip and to a portion of the side regions of the connective bumps, as seen at block 320. The underfill material may be applied, for example, using a screen. The screen typically has features such as cutouts and windows to allow underfill material to be applied through the screen and onto the bumped flip chip. The screen may be aligned to the bumped flip chip or to an array of bumped flip chips on a semiconductor wafer. The underfill material may be in the form of a viscous liquid, paste, gel, suspension, or slurry such that the underfill material can be applied through the screen. The underfill material may then be dried and stabilized, partially cured, or otherwise solidified. The underfill material is often dried to remove the majority or all of the solvents from the underfill material. After application and prior to drying, the underfill material may be removed from an upper portion of the connective bumps as needed, such as with a squeegee or other wiping tool.

The underfill material may include, for example, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, or a suitable underfill compound.

In an exemplary embodiment of the present invention, the underfill material is applied by positioning a patterned mask against the active surface of the flip chip, and dispensing the underfill material through the patterned mask. The patterned mask often comprises a fine-mesh screen with one or more barrier features on the screen. The barrier features may include features that cover, for example, connective bumps and locations where no underfill material is desired. The patterned mask may include barrier features over the streets when wafer-level underfill is applied. Alternatively, the patterned mask may be a stencil with holes and other features punched or formed in a sheet of material such as plastic or metal.

In an alternative embodiment, the underfill material is applied by positioning a patterned underfill film against the active surface of the flip chip, and pressing the patterned underfill film onto the flip chip. For example, the underfill material may be applied to the bumped flip chip using a die-cut film, a laminate of an underfill material and a backing layer, or another sheet form of patterned underfill material. The patterned underfill film includes a thin layer of underfill material such as an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, or any suitable underfill compound. The backing layer may be a transparent plastic, mylar or acetate sheet used to support the underfill material.

Windows, apertures, streets and other features are typically formed in the underfill layer. The underfill material may be cut or punched with a die to form prescribed shapes. Alternatively, the underfill material may be selectively ablated with a laser, or fashioned into the desired patterns using any suitable formation technique.

The die-cut film or patterned underfill film of one exemplary embodiment is aligned to the bumped flip chip, positioned against the bumped surface of the flip chip, and pressed onto the flip chip while heating to adhere the underfill material to the flip chip. The backing layer then can be removed. In another embodiment, the region between the patterned underfill film and the flip chip is pumped out to remove any air, and then the underfill material is heated with the flip chip to adhere the selective underfill to the flip chip.

The underfill material may extend, for example, from the active surface of the flip chip to a thickness between nominally 20 percent and 60 percent of a connective bump height, allowing the underfill material to combine with the solder mask on the electrical substrate to provide a stress-relief layer. The stress-relief layer serves as and comprises a moisture-penetration barrier. The underfill material is applied usually to at least a portion of the side regions of the connective bumps.

The underfill material is heat-treated in a processing sometimes referred to as b-staging. The underfill material is heated to flow the underfill material around the solder bumps. The temperature and time for heat-treating and the viscosity of the underfill material may be selected such that the underfill material flows adequately around the bumps. The underfill material may be heated to a predefined temperature to drive out the remaining solvents and to solidify the material, allowing a small degree of cross-linking. Underfill materials based on epoxies and other polymeric materials are typically heated to an underfill-material staging temperature to dry the underfill material such that the underfill material is no longer tacky. The underfill material may be dried and remain uncured or be partially cured after the heating step. The underfill-material staging temperature may be between, for example, 80 degrees centigrade and 150 degrees centigrade. The heat-treatment step is often done in a controlled environment such as air, nitrogen, or vacuum. Staging temperatures are typically sustained for thirty minutes to over two hours.

In one embodiment, a flux layer is applied to the flip chip, as seen at block 330. The flux layer is applied to at least a top portion of the connective bumps. The flux layer may be applied, for example, by using a stencil, a screen with features, or a patterned mask. The flux layer may be applied to the connective bumps by dispensing a flux material through the stencil, screen or patterned mask and drying it. Alternatively, the flux layer may be applied by spraying the active side of the flip chip or a select area of the electrical substrate. Alternatively, the flux layer may be applied by dipping the bumped flip chip into a flux bath or flux solution and then dried.

In an alternative process, a layer of flux can be applied onto the electrical substrate. The flux may be, for example, a fluxing underfill that becomes part of the adhesive bond between the underfill and the solder mask, or it may be a no-solvent, no-clean flux that enhances soldering while not interfering with bonding between the underfill material and the solder mask. The flux layer may be applied onto the electrical substrate using an application technique such as dispensing, pin transfer, stencil printing, spraying, or any other suitable application technique. During the assembly process, once the flux application step is completed, the bumped flip chip with the pre-applied underfill material is placed over the flux layer on the electrical substrate. The assembly is then heated to achieve the bonding between the connective bumps and the electrical substrate.

The flux layer may comprise, for example, a fluxing underfill or a flux with properties that will not interfere with formation of a bond between the underfill material and the solder mask. Flux may be included in the underfill material such as when fluxing underfill material is used. Volatile compounds would not be emitted, for example, during reflow of the "solvent-free" solder flux. Examples of fluxing underfills include Dexter FF 2200 or Loctite 3594. An example of an epoxy flip-chip flux is PK-001 manufactured by Indium Corporation of America of Clinton, N.Y. Alternatively, the flux layer may be applied prior to application of the underfill material.

Flux may be omitted entirely, for example, when metals are selected for the connective bumps and the pads on the electrical substrate that do not require solder flux such as non-oxidizing noble metal bumps. In another example, flux may be omitted for bumps that are thermosonically bonded to the electrical substrate pads.

The flip chip is positioned on the electrical substrate, as seen at block 340. The thinner underfill material allows for cleaner bumps and improved vision recognition when the bumped flip chips are robotically placed. The electrical substrate includes a thick layer of a solder mask disposed on the electrical substrate. The bumps are retained in the desired position during the placement stage, in part by positioning the bumps into corresponding holes in the solder mask.

The solder mask may be applied to the electrical substrate in one or more printing passes to achieve the desired thickness of the solder mask that may range, for example, between twenty-five micrometers above traces on the electrical substrate to as thick as 65 micrometers or thicker. In another example, the solder mask comprises a thickness between nominally 40 percent and 80 percent of a connective bump height. The desired thickness of solder mask may be determined in conjunction with the thickness and flow properties of the underfill material. The total thickness of the underfill material and the solder mask may be greater than, for example, the initial bump height. A total thickness greater than the bump height along with the application of heat and pressure during placement creates less underfill height tolerance sensitivity and an ability to create a fillet around the edges of the bumped flip chip with the excess underfill material. In another example, the total thickness of the underfill material and the solder mask is equal to or less than the initial bump height. With the application of heat and pressure, a continuous, void-free bond may be obtained with controlled fillet size.

The electrical substrate may be a printed wiring board or any substrate to which the flip chip can be attached to form a flip-chip assembly. The electrical substrate may be, for example, a printed circuit board, a flame-retardant fiberglass board, an organic circuit board, a motherboard, a ceramic substrate, a hybrid circuit substrate, an integrated circuit package, a polyimide tape, a flex circuit, a high-density interconnect board, or an electronic module.

The flip chip is heated to connect the flip chip electrically to the electrical substrate, as seen at block 350. The flip chip may be heated to or above a reflow temperature of the bumped flip chip to electrically and mechanically connect the flip chip to the electrical substrate. The flip chip and electrical substrate may be heated, for example, in a convective oven or by passing them through a forced-air furnace equipped with a conveyor belt. The reflow temperature may exceed the eutectic temperature of the solder bumps or balls, causing the connective bumps to melt and metallurgically bond to pads on the electrical substrate. After a dwell time of, for example, twenty seconds to two minutes or more, the heat source may be removed and the flip-chip assembly is cooled to room temperature. The reflow temperature, for example, may be between 183 degrees centigrade and 220 degrees centigrade for lead-tin solder bumps. The reflow temperature, for example, may be between 220 degrees centigrade and 250 degrees centigrade for lead-free or low lead-content bumps. The reflow temperature may extend as low as 160 degrees centigrade or lower when low-temperature solders based on indium or other materials are used.

The thickness of the underfill layer may change after reflow as the deposited volume of underfill material on the bumped flip chip flows to fill cavities in the solder mask, other openings in the solder mask, and a perimeter fillet. The solder mask may have a thickness, for example, between nominally 40 percent and 80 percent of the initial height of a connective bump height on the bumped flip chip. The solder mask works in tandem with the thin layer of underfill material to provide a void-free die attach. The solder mask material should have a good adhesion to the underfill material and minimum thermal expansion mismatch to provide stress relief for the flip-chip assembly.

The reflow temperature may also allow the underfill material to flow around the side regions of the connective bumps. The underfill material and the solder mask combine to provide a strong mechanical bond between the flip chip and the electrical substrate. The underfill material and the solder mask combine to form a stress-relief layer when the flip chip is electrically connected to the electrical substrate. Additional heat cycles may be added to further cure the underfill material and to improve the adhesive bond between the underfill material and the solder mask.

Excess underfill material applied to the bumped flip chip may flow out from the area between the bumped flip chip and the electrical substrate to form a controlled fillet around the sides of the bumped flip chip. The sum of the underfill material thickness and the solder mask thickness cooperate to provide the desired underfill material excess volume and the desired fillets.

An encapsulant or other suitable protective material may subsequently encase the flip-chip assembly. In some embodiments, a post-cure step is incorporated. The underfill material may be heated to an underfill post-cure temperature of between, for example, 100 degrees centigrade and 150 degrees centigrade, for a time on the order of 15 to 30 minutes.

Figure 4:
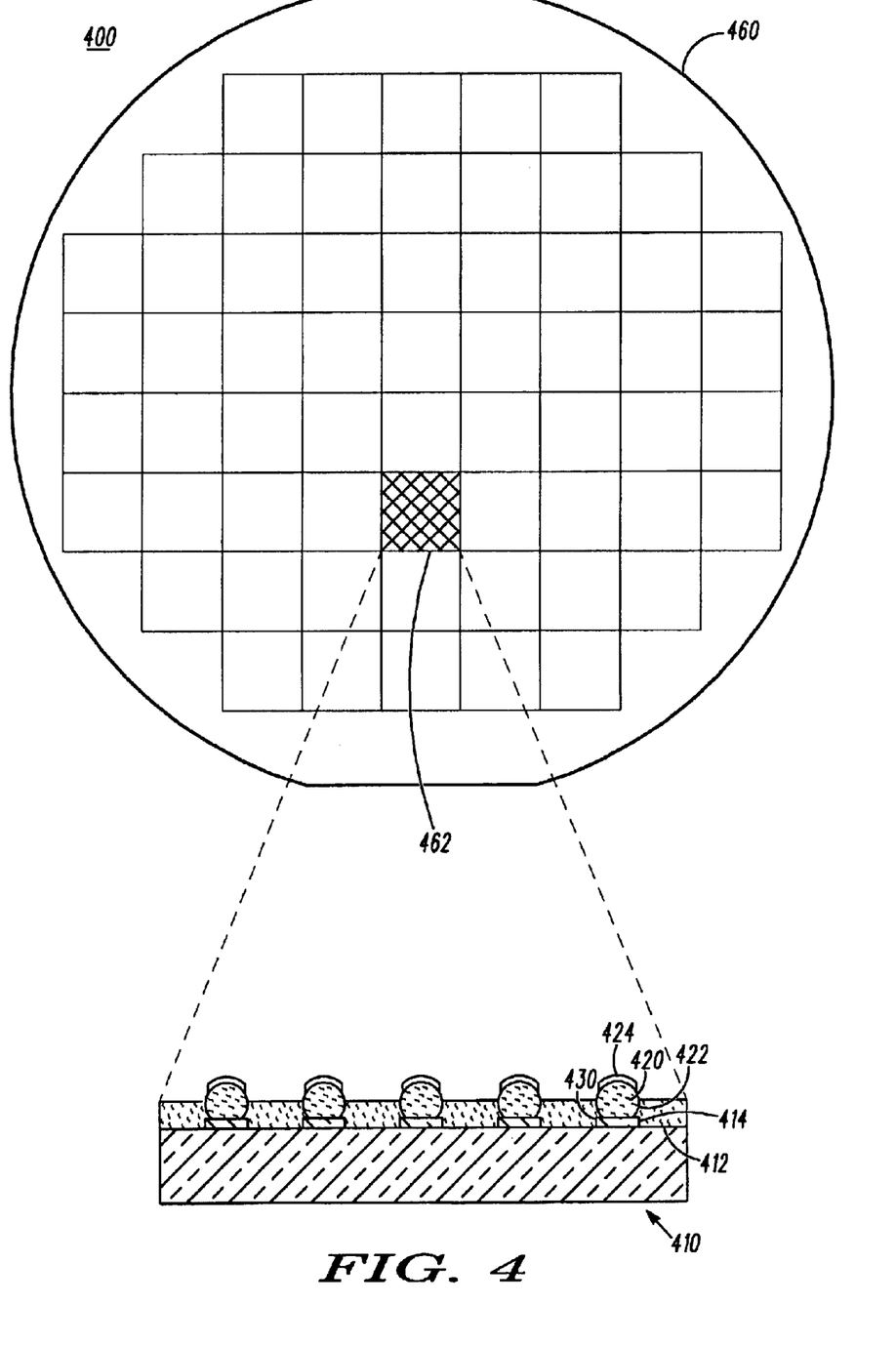
FIG. 4 illustrates a bumped semiconductor wafer with wafer-applied underfill, in accordance with one embodiment of the current invention.

FIG. 4 shows a bumped semiconductor wafer with wafer-applied underfill, in accordance with one embodiment of the present invention at 400. Bumped semiconductor wafer with wafer-applied underfill 400 includes a semiconductor wafer 460 with an array of bumped die 462. Bumped die 462 includes a series of traces and pads 414 on an active surface 412 of semiconductor wafer 460. Each bumped die 462 includes a plurality of connective bumps 420 extending from active surface 412 of semiconductor wafer 460. Connective bumps 420 comprise at least one solder bump or at least one solder ball on active surface 412 of semiconductor wafer 460. The solder balls or solder bumps are typically formed by metal depositions, metal electroplating, solder ball placement, stencil printing of solder paste, or other bump-formation processes as currently known in the art.

An underfill material 430 is disposed on active surface 412 of semiconductor wafer 460. Underfill material 430 extends, for example, from active surface 412 of semiconductor wafer 460 to a thickness less than approximately 60 percent of a connective bump height. In one example, the thickness of underfill material 430 is no less than 20 percent of the height of a bump. The underfill material may be applied to a portion of side regions 422 of connective bumps 420. The underfill material may be heated to flow the underfill material around the sides of connective bumps 420.

A flux layer 424 may be disposed on the top of connective bumps 420. Flux layer 424 may be limited to the tops of the bumps. Alternatively, flux layer 424 may be sprayed across the tops of connective bumps 420 and underfill material 430. In yet another embodiment, flux may be included within underfill material 430. Flux layer 424 may be applied before or after application of underfill material 430. Bumped flip chips 410 may be extracted from semiconductor wafer 460 after dicing.

Figure 5:
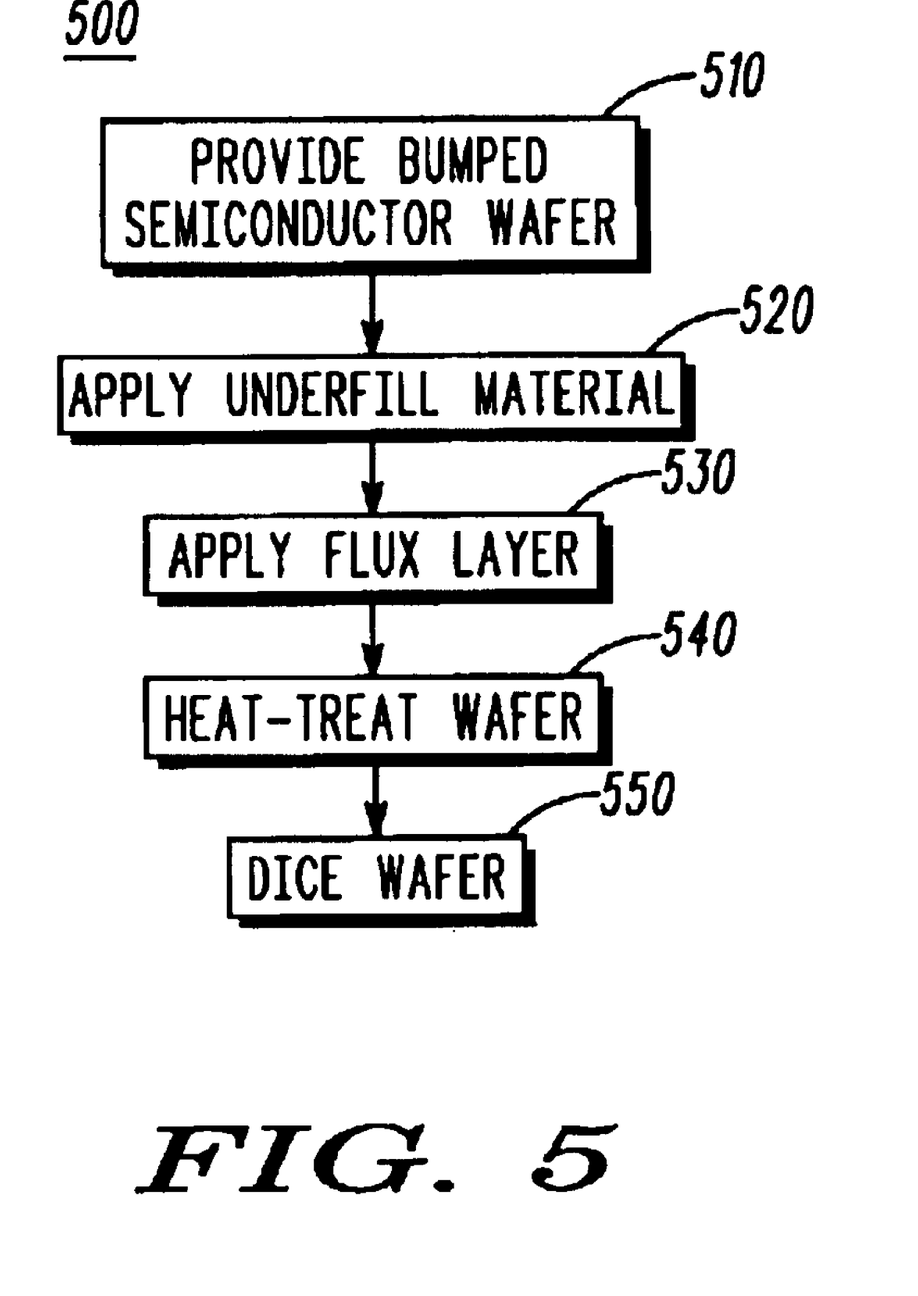
FIG. 5 illustrates a flow diagram for a wafer-applied underfill process, in accordance with one embodiment of the current invention.

FIG. 5 shows a flow diagram for a wafer-applied underfill process, in accordance with one embodiment of the present invention at 500. Wafer-applied underfill process 500 includes steps to apply underfill material to a bumped semiconductor wafer.

A bumped semiconductor wafer is provided, as seen at block 510. The bumped semiconductor wafer includes an active surface and a plurality of connective bumps extending from the active surface. The connective bumps typically comprise solder bumps or solder balls.

An underfill material is applied to the active surface of the semiconductor wafer and a portion of a side region of the connective bumps, as seen at block 520. In one example, the underfill material extends from the active surface to a thickness less than nominally 60 percent of a connective bump height. In another example, the underfill material extends from the active surface to a thickness between nominally 20 percent and 60 percent of a connective bump height.

The underfill material may include, for example, an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, or a suitable underfill compound. The underfill material may be applied, for example, by using a screen, a stencil, or a patterned mask through which the underfill material is dispensed. A squeegee may be used to apply the underfill material. The squeegee or other wiping tool may be used to remove the underfill material from the tops of the bumps. The underfill material may be dried by heating the semiconductor wafer to a drying temperature, or by evaporating off solvents from the underfill material in a vacuum or otherwise controlled environment.

Alternatively, the underfill material may be applied by aligning a patterned underfill film to the bumped semiconductor wafer. The patterned underfill film often includes a backing layer, an underfill material disposed on the backing layer, and at least one open feature in the underfill material corresponding to the plurality of connective bumps. The patterned underfill film may be laminated to the bumped semiconductor wafer, such as by pressing the patterned underfill film against the bumped semiconductor wafer when the patterned underfill film and the bumped semiconductor wafer are at a lamination temperature. A typical lamination temperature is between 60 degrees centigrade and 100 degrees centigrade, for example. The patterned underfill film may be pressed with a hot roller, with a press, or with any suitable pressing mechanism. Alternatively, the patterned underfill film may be laminated by pumping out a region between the patterned underfill film and the bumped semiconductor wafer to remove trapped air and to firmly hold the patterned underfill film against the bumped semiconductor wafer, and by heating the patterned underfill film and the bumped semiconductor wafer to a lamination temperature. The bumped semiconductor wafer and the patterned underfill film is heated to a lamination temperature usually between 60 degrees centigrade and 100 degrees centigrade. The backing layer is removed from the patterned underfill film, and the underfill material layer remains laminated to the bumped semiconductor wafer. The backing layer may be removed by peeling back or otherwise separating it from the underfill material and the bumped semiconductor wafer.

A flux layer is often applied to the connective bumps, as seen at block 530. The flux layer may be applied to at least a top portion of the connective bumps. In one embodiment of the present invention, a screen, stencil, or patterned mask is used to apply the flux layer to the tops of the bumps. Alternatively, the flux can be sprayed onto the bumps and the wafer. In another embodiment the flux is applied by dipping the semiconductor wafer into a flux solution and then drying the flux solution to leave a thin layer of flux on the solder bumps or solder balls. In yet another embodiment, the flux is included within the underfill material. The flux layer may be applied after the underfill material is applied, as illustrated. Alternatively, the flux layer may be applied prior to underfill application. The flux layer may be applied after the application of underfill material as illustrated. Alternatively, the flux layer may be applied before the application of the underfill material.

The semiconductor wafer with the underfill material is heated to flow the underfill material around the connective bumps, as seen at block 540. The underfill material may be heated to or above an underfill-material staging temperature. The staging temperature is selected to drive off and evaporate any remaining solvents from within the underfill material. The underfill material can be dried, for example, until it is no longer tacky or has a desired level of tackiness. During this heat treatment, the underfill may become partially crosslinked or partially cured.

The underfill-material staging temperature is typically between 80 degrees centigrade and 150 degrees centigrade. Drying times may be between two minutes and twenty minutes or longer. The underfill material may partially cure during this step. The underfill material usually is softened and flows to provide good adhesion and coverage of the side regions of the bumps. Typically when staging cycles are used, the cycles are greater than ten minutes to over two hours at a temperature up to 150 degrees centigrade or higher in an air, nitrogen, or other controlled environment.

The semiconductor wafer with the underfill material is diced, as seen at block 550. The semiconductor wafer may be diced to form individual bumped flip chips using a dicing saw or similar equipment available in the semiconductor industry for dicing wafers. The dicing is accomplished typically by attaching the semiconductor wafer to an adhesive backing material and then cutting the wafer along scribe lines between the bumped die. The bumped die are then removed and may be placed onto tape and reel, into waffle packs, or in other suitable media for storage and shipping. The flip chips have bumps and thin underfill material that are suitable for attachment to printed wiring boards and other electrical substrates in flip-chip assemblies.

Although dicing is typically performed after bumping and the application of wafer-applied underfill, dicing can be done prior to application of the underfill material, for example, or before application of the flux layer.

While the embodiments of the invention disclosed herein are presently preferred, various changes and modifications can be made without departing from the spirit and scope of the invention. The scope of the invention is indicated in the appended claims, and all changes that come within the meaning and range of equivalents are intended to be embraced therein.

What is claimed is:

1. A method for attaching a flip chip to an electrical substrate, comprising:
   providing a bumped flip chip, the flip chip including an active surface and a plurality of connective bumps extending from the active surface, each connective bump including a side region;
   applying a layer of an underfill material to the active surface of the flip chip and to a portion of the side regions of the connective bumps, the underfill material extending from the active surface of the flip chip to a thickness between nominally 20 percent and 60 percent of a connective bump height;
   positioning the flip chip on the electrical substrate, the electrical substrate including a layer of a solder mask disposed on the electrical substrate; and
   heating the flip chip to electrically connect the flip chip to the electrical substrate, wherein the underfill material and the solder mask combine to form a stress-relief layer when the flip chip is electrically connected to the electrical substrate.

2. The method of claim 1 wherein the electrical substrate is selected from the group consisting of a printed wiring board, a printed circuit board, a flame-retardant fiberglass board, an organic circuit board, a motherboard, a ceramic substrate, a hybrid circuit substrate, an integrated circuit package, a polyimide tape, a flex circuit, a high-density interconnect board, and an electronic module.

3. The method of claim 1 wherein the connective bumps comprise at least one solder bump or at least one solder ball on the active surface of the flip chip.

4. The method of claim 1 wherein the underfill material is applied using a screen.

5. The method of claim 4 wherein the underfill material is removed from an upper portion of the connective bumps.

6. The method of claim 1 wherein applying the underfill material comprises:
   positioning a patterned mask against the active surface of the flip chip; and
   dispensing the underfill material through the patterned mask.

7. The method of claim 1 wherein applying the underfill material comprises:
   positioning a patterned underfill him against the active surface of the flip chip; and
   pressing the patterned underfill film onto the flip chip.

8. The method of claim 1 wherein the solder mask comprises a thickness between nominally 40 percent and 80 percent of a connective bump height.

9. The method of claim 1 wherein the stress-relief layer comprises a moisture penetration barrier.

10. The method of claim 1 wherein the underfill material comprises a material selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, and a suitable underfill compound.

11. The method of claim 1 wherein the flip chip is heated to a reflow temperature of the bumped flip chip.

12. The method of claim 1 further comprising:
   applying a flux layer to at least a top portion of the connective bumps.

13. A flip-chip assembly, comprising:
   a bumped flip chip including an active surface and a plurality of connective bumps extending from the active surface;
   a layer of an underfill material disposed on the active surface of the flip chip and on a portion of a side region of the connective bumps, the underfill material extending from the active surface of the flip chip to a thickness between nominally 20 percent and 60 percent of a connective bump height; and
   a layer of a solder mask disposed on an electrical substrate; wherein the underfill material and solder mask combine to form a stress-relief layer when the flip chip is electrically connected to the electrical substrate.

14. The assembly of claim 13 wherein the electrical substrate is selected from the group consisting of a printed wiring board, a printed circuit board, a flame-retardant fiberglass board, an organic circuit board, a motherboard, a ceramic substrate, a hybrid circuit substrate, an integrated circuit package, a polyimide tape, a flex circuit, a high-density interconnect board, and an electronic module.

15. The assembly of claim 13 wherein the connective bumps comprise at least one solder bump or at least one solder ball on the active surface of the flip chip.

16. The assembly of claim 13 wherein the stress-relief layer comprises a moisture-penetration barrier.

17. The assembly of claim 13 wherein the underfill material comprises a material selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, and a suitable underfill compound.

18. The assembly of claim 13 wherein the underfill material extends from the active surface of the flip chip to a thickness between nominally 20 percent and 60 percent of a connective bump height.

19. The assembly of claim 13 wherein the solder mask comprises a thickness between nominally 40 percent and 80 percent of a connective bump height.

20. A wafer-applied underfill process, comprising:
   providing a bumped semiconductor wafer including an active surface and a plurality of connective bumps extending from the active surface;
   applying an underfill material to the active surface of the semiconductor wafer and a portion of a side region of the connective bumps, wherein the underfill material extends from the active surface to a thickness between nominally 20 percent and 60 percent of a connective bump height; and
   heating the underfill material to flow the underfill material around the connective bumps.

21. The process of claim 20 wherein the connective bumps comprise at least one solder bump or at least one solder ball on the active surface of the semiconductor wafer.

22. The process of claim 20 wherein the underfill material comprises a material selected from the group consisting of an epoxy, a thermoplastic material, a thermoset material, polyimide, polyurethane, a polymeric material, a filled epoxy, a filled thermoplastic material, a filled thermoset material, filled polyimide, filled polyurethane, a filled polymeric material, a fluxing underfill, and a suitable underfill compound.

23. The process of claim 20 wherein the underfill material is heated to an underfill-material staging temperature.

24. The process of claim 21 further comprising:
applying a flux layer to at least a top portion of the connective bumps.

25. The process of claim 20 further comprising:
dicing the bumped semiconductor wafer.

26. A method for attaching a flip chip to an electrical substrate, comprising:

providing a bumped flip chip, the flip chip including an active surface and a plurality of connective bumps extending from the active surface, each connective bump including a side region;

applying a layer of an underfill material to the active surface of the flip chip and to a portion of the side regions of the connective bumps, and removing the underfill material from an upper portion of the connective bumps;

positioning the flip chip on the electrical substrate, the electrical substrate including a layer of a solder mask disposed on the electrical substrate; and heating the flip chip to electrically connect the flip chip to the electrical substrate, wherein the underfill material and the solder mask combine to form a stress-relief layer when the flip chip is electrically connected to the electrical substrate.

27. A method for attaching a flip chip to an electrical substrate, comprising:

providing a bumped flip chip, the flip chip including an active surface and a plurality of connective bumps extending from the active surface, each connective bump including a side region;

applying a layer of an underfill material to the active surface of the flip chip and to a portion of the side regions of the connective bumps by positioning a patterned underfills film against the active surface of the flip chip; and pressing the patterned underfill film onto the flip chip;

positioning the flip chip on the electrical substrate, the electrical substrate including a layer of a solder mask disposed on the electrical substrate; and heating the flip chip to electrically connect the flip chip to the electrical substrate, wherein the underfill material and the solder mask combine to form a stress-relief layer when the flip chip is electrically connected to the electrical substrate.

* * * * *

UNITED STATES PATENT AND TRADEMARK OFFICE
CERTIFICATE OF CORRECTION

PATENT NO. : 6,774,497 B1  Page 1 of 1
APPLICATION NO. : 10/402631
DATED : August 10, 2004
INVENTOR(S) : Jing Qi et al.

It is certified that error appears in the above-identified patent and that said Letters Patent is hereby corrected as shown below:

In Column 18, Line 14, Claim No. 27:
  Change "underfills" to --underfill--

Signed and Sealed this

Tenth Day of April, 2007

JON W. DUDAS
*Director of the United States Patent and Trademark Office*